US008169678B2

(12) United States Patent (10) Patent No.: US 8,169,678 B2
Hofmann et al. (45) Date of Patent: May 1, 2012

(54) MICRO-MIRROR ACTUATOR HAVING ENCAPSULATION CAPABILITY AND METHOD FOR THE PRODUCTION THEREOF

(75) Inventors: Ulrich Hofmann, Itzehoe (DE); Marten Oldsen, Hamburg (DE)

(73) Assignee: Fraunhofer-Gesellschaft zur Forderung der angewandten Forschung e.V. (DE)

( * ) Notice: Subject to any disclaimer, the term of this patent is extended or adjusted under 35 U.S.C. 154(b) by 419 days.

(21) Appl. No.: 12/517,241

(22) PCT Filed: Dec. 11, 2007

(86) PCT No.: PCT/DE2007/002226
§ 371 (c)(1),
(2), (4) Date: Jun. 2, 2009

(87) PCT Pub. No.: WO2008/071172
PCT Pub. Date: Jun. 19, 2008

(65) Prior Publication Data
US 2010/0085622 A1  Apr. 8, 2010

(30) Foreign Application Priority Data

Dec. 12, 2006  (DE) .......................... 10 2006 058 563

(51) Int. Cl.
*G02B 26/08* (2006.01)
(52) U.S. Cl. .................................................. 359/221.2
(58) Field of Classification Search .................. 438/52; 359/223.1–226.1, 290, 291, 871, 872, 212.1–214.1
See application file for complete search history.

(56) References Cited

U.S. PATENT DOCUMENTS

| 6,016,217 | A | 1/2000 | Dotzel et al. .................. 359/292 |
| 6,146,917 | A | 11/2000 | Zhang et al. .................... 438/51 |
| 6,404,313 | B2 | 6/2002 | Asada ........................... 335/222 |
| 7,079,299 | B1 | 7/2006 | Conant et al. ................. 359/224 |
| 7,205,174 | B2 * | 4/2007 | Hung .............................. 438/52 |
| 7,239,487 | B2 * | 7/2007 | Mastromatteo et al. ... 360/294.3 |
| 2005/0139542 | A1 | 6/2005 | Dickensheets et al. ....... 210/490 |
| 2005/0213230 | A1 | 9/2005 | Mochizuki .................... 359/876 |
| 2005/0231793 | A1 | 10/2005 | Sato .............................. 359/291 |

OTHER PUBLICATIONS

*High-Aspect Ratio Vertical Comb-Drive Actuator With Small Self-aligned Finger Gaps;* Carlen et al., Journal of Microelectromechanical Systems, vol. 14, No. 5, Oct. 2005, pp. 1144-1155.

* cited by examiner

*Primary Examiner* — Euncha Cherry
(74) *Attorney, Agent, or Firm* — Renner Kenner Greive Bobak Taylor & Weber

(57) ABSTRACT

The present invention relates to a method for producing a micro-mirror actuator and the corresponding actuator. In the method, the actuator is generated from a layered construction made of at least three main layers (101, 103, 107), which are at least sectionally electrically insulated from one another via intermediate layers (102, 104, 106). The layers are structured to form the micro-mirror element and the electrodes, the structuring being performed in such a way that a closed frame (310) is formed from at least the uppermost layer (107) around the inner area of the actuator, which allows a hermetic encapsulation of the inner area by application of a cover plate onto the frame. Furthermore, a conductor level (105), which is electrically insulated from these layers via the intermediate layers, is generated between at least two of the layers and structured to form conductor paths, via which one or more electrodes may be electrically contacted from outside the frame (310) after the formation of contact openings in one or more of the intermediate layers (102, 104, 106).

A hermetically sealed encapsulation of the inner area of actuator may already be achieved easily at the wafer level using the method.

11 Claims, 7 Drawing Sheets

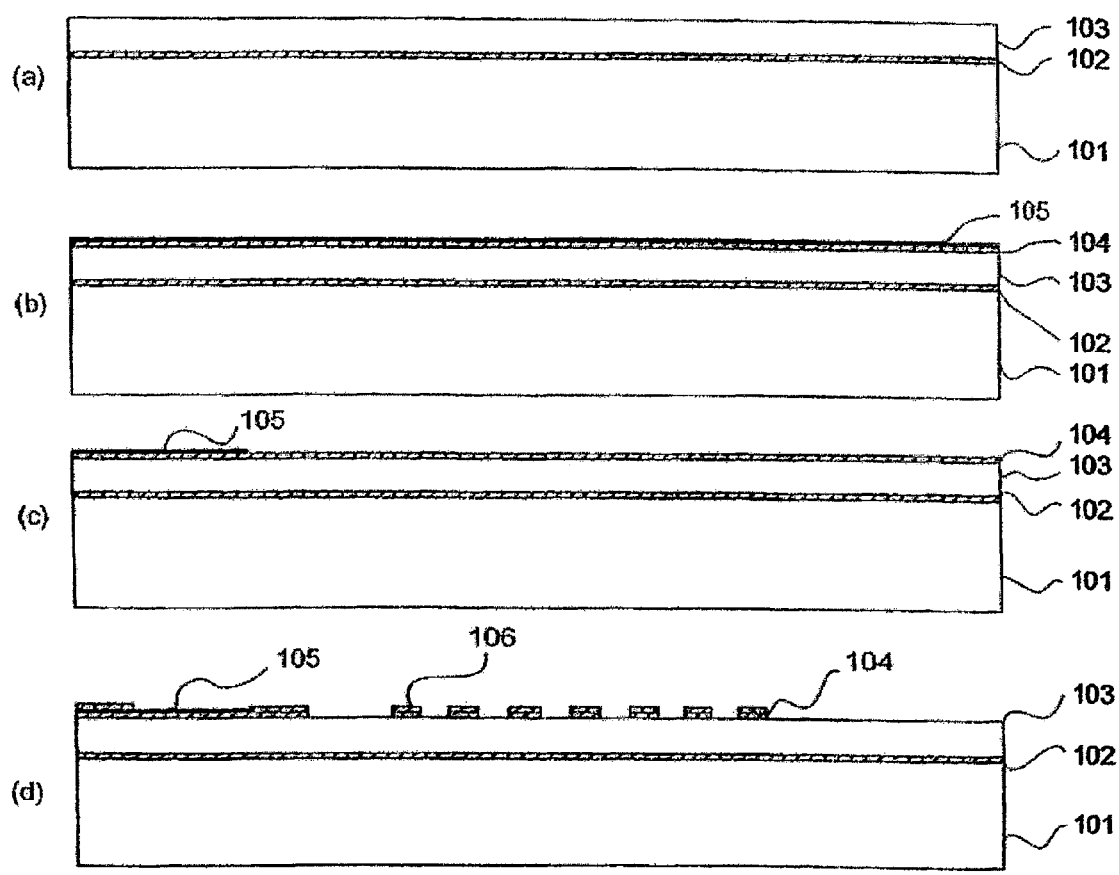
Fig. 1 (a - d)

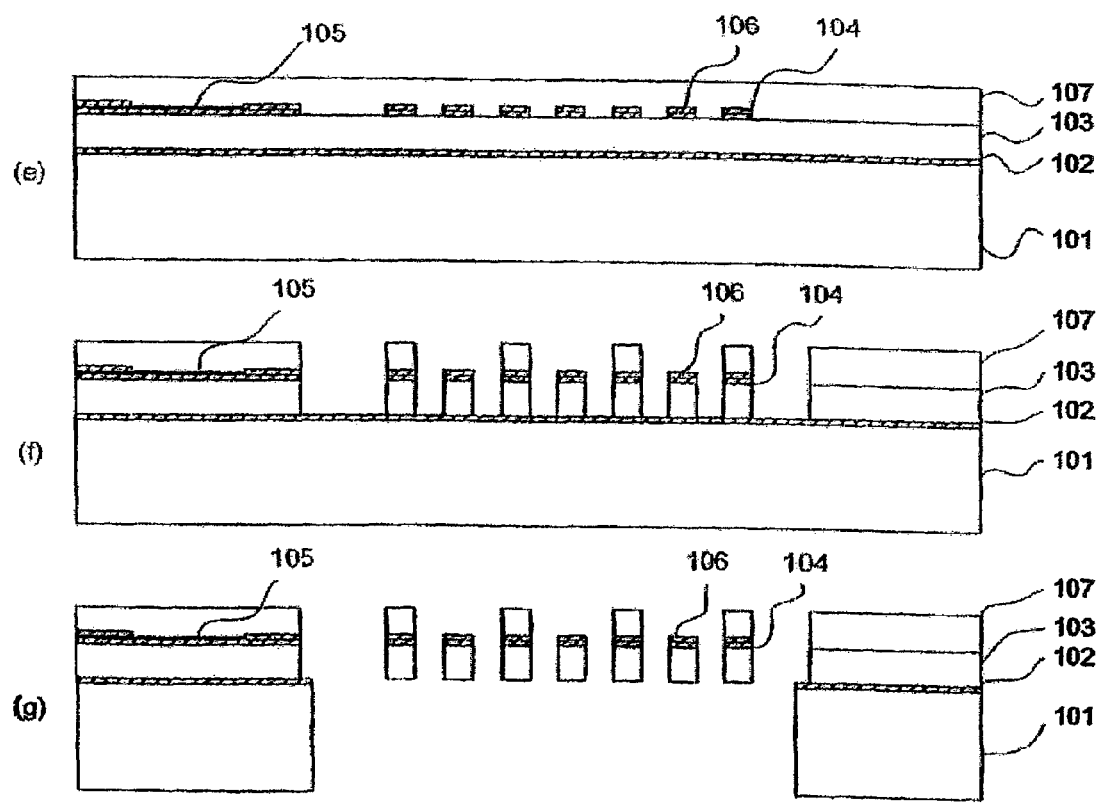
Fig. 1 (e - g)

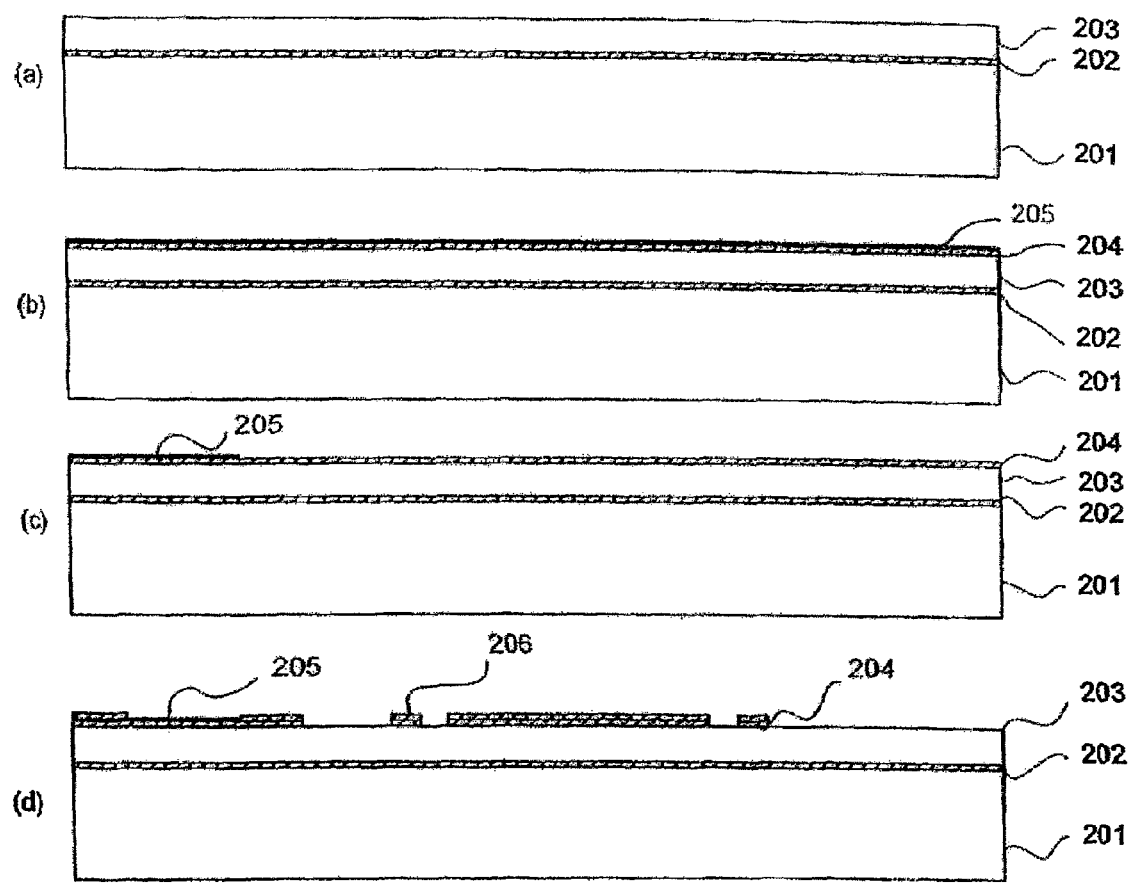

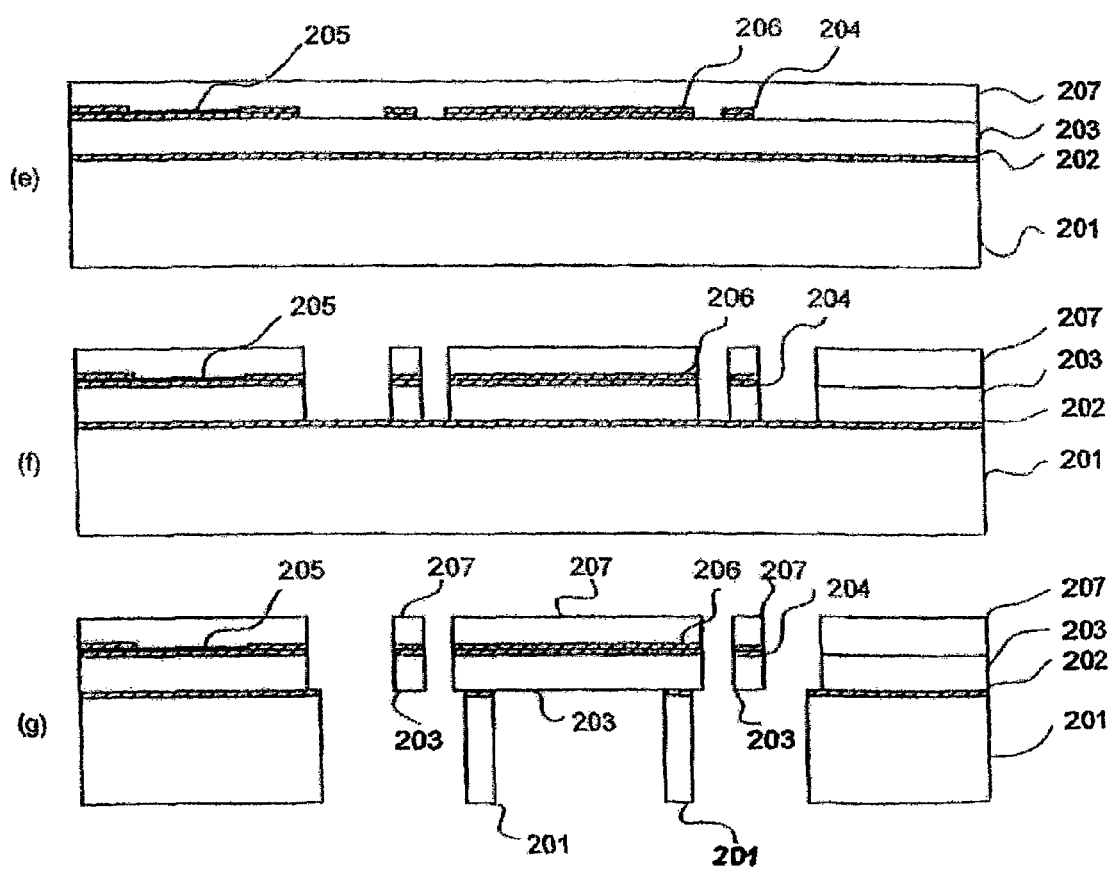

MICRO-MIRROR ACTUATOR HAVING ENCAPSULATION CAPABILITY AND METHOD FOR THE PRODUCTION THEREOF

TECHNICAL AREA

The present invention relates to a micro-mirror actuator, which has at least one movable micro-mirror element and multiple finger-shaped or comb-shaped electrodes for activating the micro-mirror element in an inner area, the electrodes being offset to one another in height, the actuator being formed by a layered construction made of at least three main layers, which are at least sectionally electrically insulated from one another via intermediate layers, and a method for the production thereof.

Micro-electromechanical components (MEMS) are usable for numerous applications. Examples of these are acceleration sensors, speed sensors, or optical micro-sensors. Many of these MEMS components differ in the type of activation or the sampling of the actuator or sensor element, which is formed by a movable structure in the inner area of the component. The present invention relates to micro-mirror actuators, in which the movable micro-mirror element is activated or sampled by multiple electrodes. A special area of application is represented by electrostatically driven micro-scanner mirrors in this case.

PRIOR ART

Micro-scanner mirrors may be used, for example, in barcode read devices, in circuit board exposure units, in laser scanning microscopes, in imaging laser projection, or in optical network switches.

Comb-shaped or finger-shaped electrodes are partially used for activating the actuator elements, which are formed by mirror plates, of micro-scanner mirrors, in order to allow large deflections of the actuator element even at moderate drive voltages. The advantage of intermeshing comb-shaped electrodes is increased electrical capacitance due to the greater electrode surface with concurrent low electrode spacing, even during the movement. In principle, these comb electrode drives comprise a stationary electrode comb situated on the substrate and a movable electrode comb attached to the actuator element, which intermesh. A deflection of the actuator element is achieved in some embodiments when the electrodes lie in the same plane in that manufacturing-related asymmetries of the electrode structure generate electrical fields, which are not entirely identical, on the intermeshing electrode combs. Upon excitation of the actuator element at its resonance frequency, initially very small deflections may be escalated to large amplitudes of several degrees. A disadvantage of this principle is that a mirror actuator of this type only displays usefully large deflections at its resonance frequency and is therefore greatly restricted in its possible uses. In addition, the transient oscillation procedure is not uniquely defined because of a lack of preferential direction, so that the actuator element may oscillate in different directions. The phase position of the actuator element in relation to its excitation signal is thus not uniquely defined and may vary by 180°.

To avoid these problems, comb electrodes are used in which static and movable electrode combs have a mutual height offset. Using a configuration of this type, it is possible to set a defined angle within a tilting range of the actuator element, which is predetermined by the height offset of the comb electrodes. In addition to the resonant operation, a quasi-static operation is thus possible, at least at frequencies below the resonant frequency.

A method for producing a micro-actuator of this type, in which a layered construction made of at least three main layers is generated, which are at least sectionally electrically insulated from one another via intermediate layers, is known from the publication of E. T. Carlen et al., High Aspect Ratio Vertical Comb-Drive Actuator with Small Self-Aligned Finger Gaps, Journal of Micro-Electromechanical Systems, volume 14, issue 5, October 2005, pages 1144 through 1155. These layers are designed and structured to form the actuator element and the comb-shaped activation electrodes, which are offset to one another in height.

To produce micro-electro-mechanical components, such as the micro-scanner mirrors described above, protection of the movable structures, i.e., the movable actuator or sensor elements, is necessary even during the production process. In particular during the isolation process, in which the wafer having the process components adjacent to one another is cut into individual actuator chips, contamination with water and sawdust arises due to the sawing process in components which are not yet encapsulated. This contamination may result very rapidly in electrical short-circuits or mechanical blockages of the micrometer-fine drive comb structures. Because many micro-scanner mirrors have an etched back trench, in particular, and the actual actuator structure represents a diaphragm, which is only a few tens of micrometers thick but simultaneously multiple millimeters in extension, the component or the chip is also very mechanically fragile in the unencapsulated state. A high manufacturing yield is therefore only possible through so-called wafer level packaging, in which the inner area of the component, in which the movable sensor or actuator element and the electrodes are situated, is already closed hermetically sealed on the wafer before the isolation. In this way, the component also has a uniform electro-mechanical behavior under greatly varying environmental conditions (temperature, pressure, ambient humidity).

Many manufacturing processes known up to this point for micro-scanner mirrors may be unified in a very restricted way or not at all with a process, which is based on anodic or eutectic wafer bonding, for achieving a hermetically sealed encapsulation, because the problems of contacting the electrodes from the outside have not permitted unrestricted encapsulation until now.

Thus, the activation of a single-axis electrostatically driven micro-scanner mirror requires two different potentials in the simplest case, which are applied via terminals outside the encapsulation and must then be led into the hermetically sealed encapsulation. This is possible if the production process provides two conductive actuator layers lying vertically one over another and insulated from one another. The single-axis mirror thus produced may be deflected quasistatically on one side upon application of a DC voltage or may be caused to resonate using a suitable AC voltage. However, if more than one comb electrode pair is used for the activation, for example, to be able to deflect the single-axis mirror not only on one side, but rather quasistatically to both sides, three potentials, which are insulated from one another, are already required, at least two of which must also be laterally insulated from one another and spatially separated. The production methods known up to this point divide the uppermost layer which conducts potential into regions spatially and electrically separated from one another for this purpose, typically by etching a trench down to the next insulation layer. However, these trenches necessary for the electrical separation obstruct the hermetic wafer level packaging, because the trenches always permit a gas exchange between the encapsulated interior and the exterior. In the case of an anodic bonding method for the encapsulation, the bonding is interrupted at the trench location. In the case of eutectic bonding, a short-circuit of the printing conductors to be insulated from one another is even generated. The conditions become significantly more complex if a dual-axis micro-scanner mirror is to be produced and not a single-axis mirror, because still further potentials to be spatially separated are added in the former.

A wafer level packaging method for MEMS components is known from U.S. Pat. No. 6,146,917, in which a silicon or glass wafer provided with cavities is bonded to the MEMS wafer either by fusion bonding or by anodic bonding, in order to achieve hermetic encapsulation. During the production process, a closed bonding area, having a planarity required for the hermetically sealed connection to a cover element, which encloses the component is kept clear on the lowermost layer formed by the wafer. The cover element is a silicon or glass wafer provided with cavities, which has suitable webs at the points of this peripheral bonding area. The electrical connection of the electrodes of the encapsulated MEMS component to the outside is performed by conductor lines implanted in the wafer, which lead laterally from the outside into the encapsulated inner area of the MEMS component.

The object of the present invention comprises disclosing a method for producing a micro-mirror actuator having at least one movable micro-mirror element and multiple finger-shaped or comb-shaped electrodes, which are offset to one another in height, the method allowing a hermetically sealed encapsulation of the inner area of the actuator already on the wafer level in a simple way. Furthermore, a correspondingly constructive micro-mirror actuator is to be provided by the invention.

DESCRIPTION OF THE INVENTION

The object is achieved by the method and the micro-mirror actuator according to Claims 1 and 8. Advantageous embodiments of the methods and the actuator are the subject matter of the subclaims were may be inferred from the following description and the exemplary embodiments.

In the present method, a layered construction made of at least three main layers is generated, preferably semiconductor layers, which are at least electrically sectionally insulated from one another via intermediate layers. The layers are designed and structured to form the micro-mirror element and the electrodes. In the proposed method, the structuring of the layers is performed in such a way that a closed (solid) frame is obtained at least from the upper main layer, which encloses the inner area of the actuator and allows a hermetic encapsulation of the inner area by application of a cover plate on the frame. The surface of the top side of the frame, i.e., the surface of the uppermost layer of the frame, is preferably polished suitably for this purpose after the structuring, if the planarity necessary is not yet adequate for a hermetically sealed application of a cover plate. Furthermore, in the present method, during the generation of the layered construction, between at least two of the layers, a conductor level, which is electrically insulated from these layers via the intermediate layers, is generated and structured to form conductor lines or paths. The structuring is performed in such a way that one or more of the electrodes may be electrically contacted from outside the frame via the conductor paths after the formation of contact openings in one or more of the intermediate layers during the production of the component. The electrodes are preferably formed in this case by at least two of the main layers, between which the conductor level is also generated. Contacting of the electrodes from outside the frame and/or the encapsulation is thus achieved by these buried conductor paths, without destroying the planar surface quality of the connection surfaces for the encapsulation which is necessary for the encapsulation. The method thus allows the production of a hermetically sealed encapsulation in a simple way, preferably using anodic or eutectic wafer bonding for the bonding of the cover plate to the frame. Instead of these two bonding methods, other bonding technologies may also be used for the production of the bond, for example, glass frit bonding.

In the proposed method, this encapsulation may already be performed on the wafer level, a further wafer or a substrate of the size of a wafer then being applied as a cover plate on the layered construction and being bonded hermetically sealed to the frames of the micro-mirror actuators situated adjacent to one another on the wafer. The cover plate may also have cavities in a known way for this purpose, in order not to impair the movement freedom of the micro-mirror elements by the cover plate. If the actuator, also referred to hereafter as the component, has a through opening through the lowermost main layer, an additional floor cover must also be provided for the hermetically sealed encapsulation. This is unproblematic, because the lowermost main layer typically comprises a wafer whose bottom side has a sufficient planarity for the bonding to a further substrate or wafer as the floor plate.

During the production of a micro-scanner mirror or another MEMS component for optical applications, it is necessary to select the cover plate, and possibly also an optionally necessary floor plate, from a material which is transparent in at least one optical wavelength range, for example, glass. This does not represent a problem in the present method, however.

The manufacturing process proposed here always provides a polished or topography-free frame, which is completely closed per se, around the inner area having the micro-mirror element and the electrodes, whose uppermost part is manufactured from the same layer from which the uppermost actuator (main) layer is also produced. In order to nonetheless be able to lead a nearly arbitrary number of potentials which are separate from one another into the encapsulation, the suggested production process also comprises, in addition to two thick, electrically conductive actuators, which may be used, for example, for mirror plate or micro-mirror elements, spring suspensions, and the height-offset electrode comb structures, a deposited conductor level. This conductor level is preferably located above the lower actuator layer, but electrically insulated thereto, and below the upper actuator layer, and also electrically insulated thereto. Islands of the upper actuator layer, which are insulated from one another by trenches, and which are located inside the inner area, may be contacted via this conductor level. For this purpose, contact holes are generated beforehand in the insulation layer, which is located below the upper actuator layer, to the conductor level structured into suitable individual conductor paths, via which the electrical connection is produced between the conductor paths and the insulated islands of the upper actuator layer.

The proposed production process allows the generation of comb electrodes offset in height to one another. These height-offset comb electrodes allow not only resonant operation, but rather also quasistatic operation of the electrostatically driven micro-mirror element. The described production sequence offers the possibility of generating movable actuator structures in at least three different layer thicknesses. A torsion spring for the suspension of the micro-mirror element may thus be produced as needed in the least layer thickness, while electrode combs for the drive and/or activation may be generated in the moderate layer thickness, for example, and the micro-mirror element may be manufactured as needed in one of the three available layer thicknesses. While a micro-scanner mirror of very small mirror diameter (<0.5 mm) may already manage with a low layer thickness, because the static deformation scales with the square of the edge length and the dynamic deformation scales with the fifth power of the edge length of the mirror, moderate and large mirror diameters (up to multiple millimeters) require correspondingly greater layer thicknesses. In addition to mirrors which are only a few tens of micrometers thick, the production process presented here also allows the manufacturing of a mirror which is up to many hundreds of micrometers thick, for example, in the thickness of a wafer. Solely the design of the photomasks for the structuring determines the thickness of the particular actuator structure. The manufacturing sequence always remains the same.

In the production sequence described in the present patent application, only high-temperature-resistant materials are preferably used, by which high-temperature wafer-bonding methods such as anodic or eutectic bonding may be used without damaging the actuator. In contrast to production processes in which conductor paths are produced from the same layer as the drive electrodes, using the concealed or buried conductor level provided here, an arbitrary number of areas of the actuator which are insulated to one another may be contacted even if the actuator is packaged hermetically sealed by a wafer level package.

The micro-mirror actuator produced using the method has at least one movable micro-mirror element in an inner area and multiple comb-shaped or finger-shaped electrodes, which are offset in height, for activating the micro-mirror element. The component is formed from a layered construction made of at least three main layers, which are at least sectionally electrically insulated from one another via intermediate layers. The inner area is enclosed by a closed frame, formed from at least the upper main layer, which allows a hermetic encapsulation of the inner area by application of a cover plate onto the frame. Between at least two of the layers, a conductor level, which is electrically insulated from these layers via the intermediate layers, having conductor paths is situated, via which one or more of the electrodes may be electrically contacted from outside the frame via contact openings in the intermediate layers. The micro-mirror actuator is preferably a micro-scanner mirror having an electrostatically driven single-axis or multiaxis micro-mirror.

BRIEF DESCRIPTION OF THE DRAWINGS

The proposed method and the associated micro-mirror actuator are explained in greater detail once again hereafter on the basis of exemplary embodiments in connection with the drawings. In the figures:

FIG. 1 shows a first example of the proposed production method;

FIG. 2 shows a second example of the proposed production method;

DETAILED DESCRIPTIONS OF THE EMBODIMENTS

Figure 3:
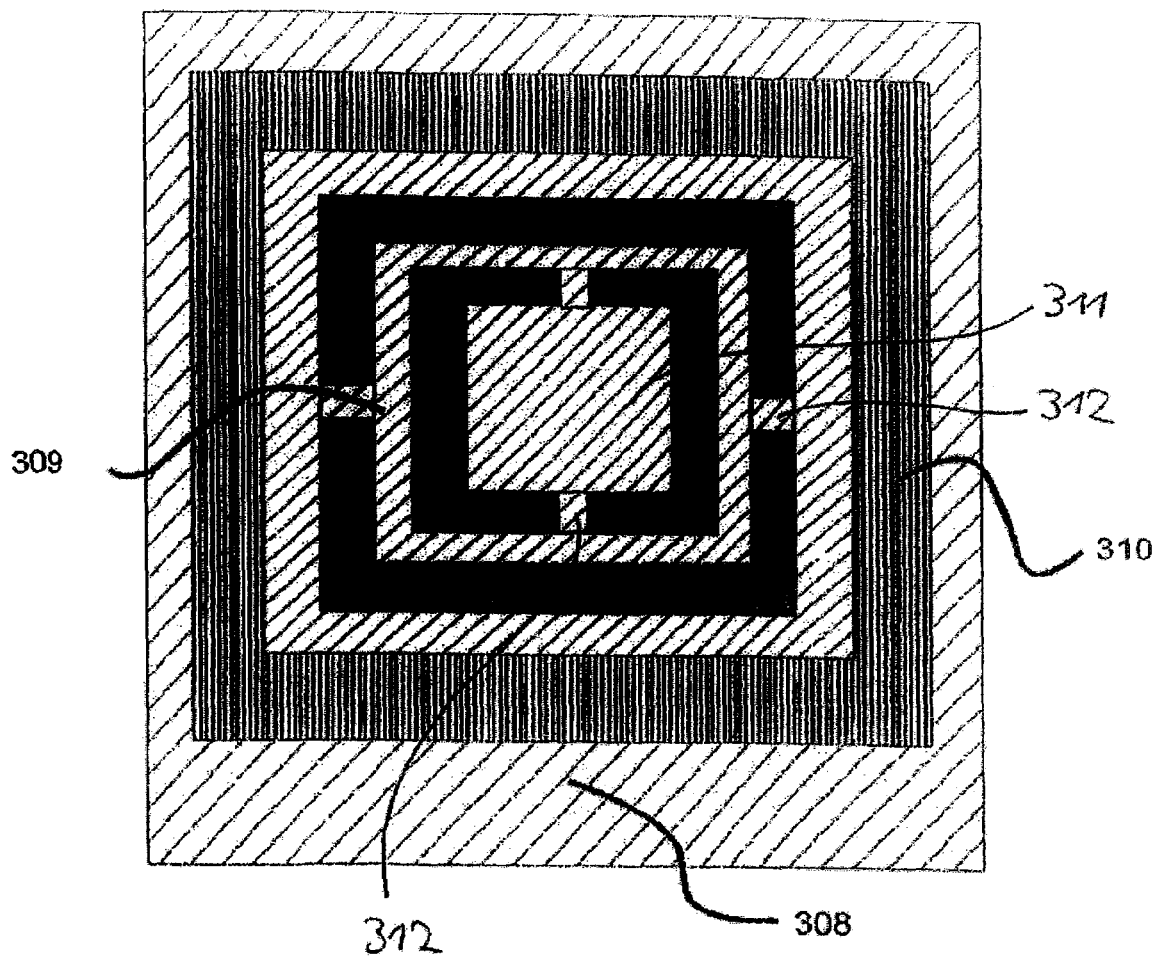
FIG. 3 shows a top view of a dual-axis micro-scanner mirror as may be obtained according to the present method.

The proposed method is described hereafter on the basis of an exemplary embodiment, in which a micro-scanner mirror is produced in silicon technology. The individual method steps may be comprehended on the basis of the partial figures (a) through (g) of FIG. 1. A silicon wafer 101 is used as the substrate material, which is coated by a thermal oxidation process with a $SiO_2$ layer 102 of 1 μm thickness, for example. A relatively thick polysilicon layer 103 of 30 μm thickness, for example, is applied by an epitaxy deposition process to this (intermediate) layer used as the first insulation layer. Polysilicon layers of this type applied by an epitaxy deposition process are also referred to hereafter as epipoly layers.

The wafer is subsequently smoothed by chemical-mechanical polishing (CMP). In this case, it is noted that FIG. 1, like FIG. 2, only shows a small partial section of the wafer, on which one micro-scanner mirror is generated. Very many micro-scanner mirrors of this type are built up adjacent to one another simultaneously in a known way on the entire wafer by the layered construction.

A commercial, single-crystalline SOI wafer substrate may also be used alternatively to these first steps.

A CVD oxide (TEOS) 104 and a further polysilicon layer 105 are deposited on the epipoly layer 103, the polysilicon layer 105 being structured by a dry etching process (FIG. 1, partial figures (b) and (c)). A further TEOS oxide layer 106 is deposited thereon, which is subsequently structured together with the one already provided by a combined wet-dry etching step (FIG. 1, partial figure (d)). A further epipoly layer 107 is deposited on this layer sequence, which is again smoothed by CMP (FIG. 1, partial figure (e)). This uppermost layer may optionally be coated using a suitable metal or a dielectric reflective layer, in order to increase the reflectivity of the later mirror plate, for example.

In a single high-speed etching step, in which the buried TEOS oxide layers function as a buried hard mask, both epipoly layers (103, 107) are structured (FIG. 1, partial figure (f)). In order to expose the actuator structure, the substrate must be etched from the back. A last etching step removes the first oxide layer 102, which separates the substrate 101 from the layers lying above (FIG. 1, partial figure (g)).

In this exemplary method sequence, the micro-scanner mirror is thus constructed from three main layers, which correspond to the substrate 101 and the two epipoly layers 103, 107. These thick main layers are electrically insulated from one another by corresponding intermediate layers, the $SiO_2$ layer 102 and the TEOS oxide layers 104, 106. Between the two TEOS oxide layers 104, 106, the polysilicon layer 105 forms a conductor level, which is structured to generate the desired conductor paths during the production process. By introducing contact holes in the upper TEOS oxide layer 106, corresponding areas of the upper main layer (epipoly layer 107) may be electrically contacted via these conductor paths. The conductor paths are accessible from the side of the layered construction, as is obvious, for example, in partial figure (g).

The structuring of the main and intermediate layers is performed in the proposed method not only in such a way that the desired actuator structure having corresponding suspensions (not visible in the figure) and the associated electrodes results, but rather also to provide a closed frame around the inner area of the component, in which the electrodes and the actuator element are situated. This frame is obvious in partial figure (g) of FIG. 1 on both sides of the exposed electrodes recognizable in this figure. The surface of the uppermost layer, the epipoly silicon layer 107, of this frame is additionally suitably polished, for example, using CMP, to obtain a planar surface quality, preferably ≦2 nm RMS, sufficient for subsequent eutectic or anodic bonding to a cover plate.

In the example shown in FIG. 1, the electrodes which are formed from the lower epipoly layer 103 pass into the mirror plate (from the same layer), which is not recognizable in the figure. The remaining electrodes from the combination of the epipoly layers 103 and 107 are rigidly anchored on the substrate 101. The fundamental construction of a micro-scanner mirror of this type having the suspensions (not shown in this figure) is known to those skilled in the art. For this purpose, reference may be made to the publication cited in the introduction to the description, for example.

For the hermetically sealed encapsulation of the inner area of a micro-scanner mirror constructed in this way, the attachment of a floor plate is also necessary in the present case, which is bonded on the substrate 101 from the back, i.e., from below in FIG. 1. This floor plate may be a further wafer, for example. The cover plate, which is placed on the frame of this component and/or the layered construction having a plurality of components of this type on the wafer, must have a cavity in this example in the area of the inner area of the components, so as not to obstruct the movement of the micro-mirror. Cover plates of this type having cavities are also already known from one of the two publications cited in the introduction to the description, so that they will not be discussed in greater detail at this point.

FIG. 2 shows the same production sequence as in FIG. 1, so that the individual partial steps will not be discussed again here. The partial figures (a) through (g) of FIG. 2 correspond in this case to the partial figures (a) through (g) of FIG. 1. In contrast to the design of FIG. 1, in the example of FIG. 2, a part of the finished actuator structure is produced in the maximum layer thickness and thus comprises the substrate 201 as the first main layer, the epipoly layer 203 as the second main layer, and the epipoly layer 207 as the third main layer. The advantage of a thick actuator structure of this type is in the achievable bending and torsion rigidity of the actuator structure. A micro-mirror which is multiple millimeters long may be cited as an exemplary application here, whose static and dynamic deformations must be minimized.

In addition, by layer deposition and structuring, the uppermost main layer 207 may be provided in the area of the mirror plate with a reflective layer, for example, in the form of a metal layer or a dielectric mirrored layer, by which the surface quality of the main layer 207 is not decreased in the area of the bond frame.

FIG. 3 shows an example of a dual-axis micro-scanner mirror 309 in a top view. In the figure, the mirror plate 311 having the suspensions 312 and the surrounding regions are shown. The inner area of this component having the comb electrodes (not shown in this figure) is enclosed by the topography-free frame 310, which is polished on the surface. This frame 310 forms a bonding surface for a hermetic wafer level package because of its freedom from topography. The area 308 represents a region outside the actuator capsule.

Figure 4:
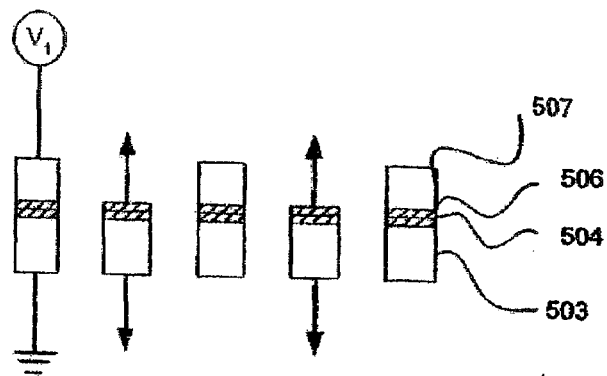
FIG. 4 shows an example of the height offset and the activation of the comb electrodes.
Figure 5:
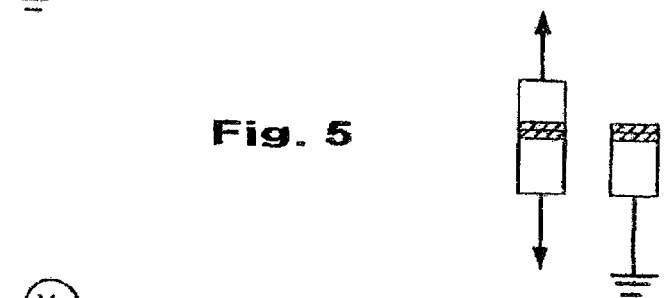
FIG. 5 shows a second example of the height offset and the configuration of the comb electrodes.
Figure 6:
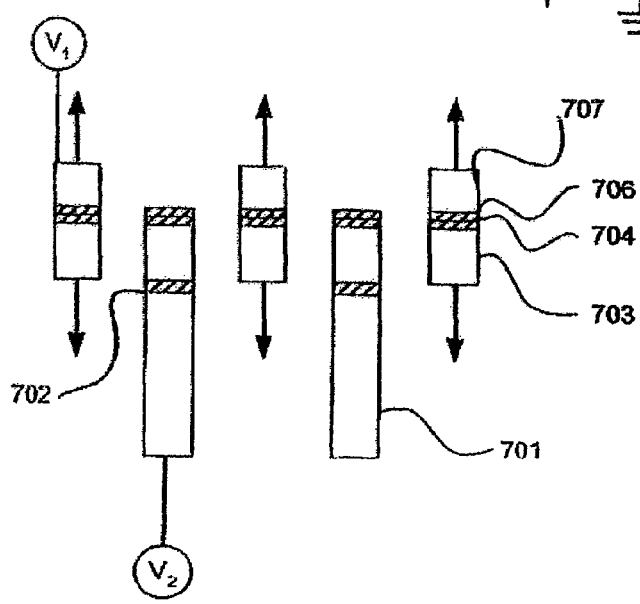
FIG. 6 shows a third example of the height offset and the configuration of the comb electrodes.

Various designs and activations of the comb-shaped electrodes are briefly explained in following FIGS. 4 through 6. In order to achieve a height offset of the electrode combs, the movable structure, i.e., the actuator element, may be equipped with electrode combs, which are solely formed by the lower epipoly layer 503, while the static counter comb electrodes are produced from both epipoly layers 503 and 507, which are insulated from one another. The electric activation is displayed in this figure and also in the two following figures.

Alternatively thereto, as shown in FIG. 5, the movable structure may also be produced with comb electrodes, which are constructed from both epipoly layers 603, 607, while the static counter comb electrode for this purpose is only formed by the lower epipoly layer 603.

In a further alternative, one of the comb structures, preferably the static comb structure, is produced from at least the lower layers, i.e., the substrate 701 and epipoly layer 703, while the movable counter comb structure is preferably constructed from the epipoly layers 703 and 707. If the comb structure components manufactured from epipoly layer 707 are set to potential V1, the components manufactured from epipoly layer 703 are consistently set to a potential different therefrom, such as ground, and the components manufactured from the substrate 701 are set to potential V2, a configuration of two height-offset comb drives stacked one above another results, which may exert more force than a single height-offset comb drive. A further advantage of a construction of this type is that the movable suspended comb structure may perform at least twice as large a vertical stroke, because the capacitance of the opposing electrodes changes over at least twice as great a distance during a vertical relative movement. This presumes that the epipoly layers 703 and 707 have the same thickness.

Figure 7:
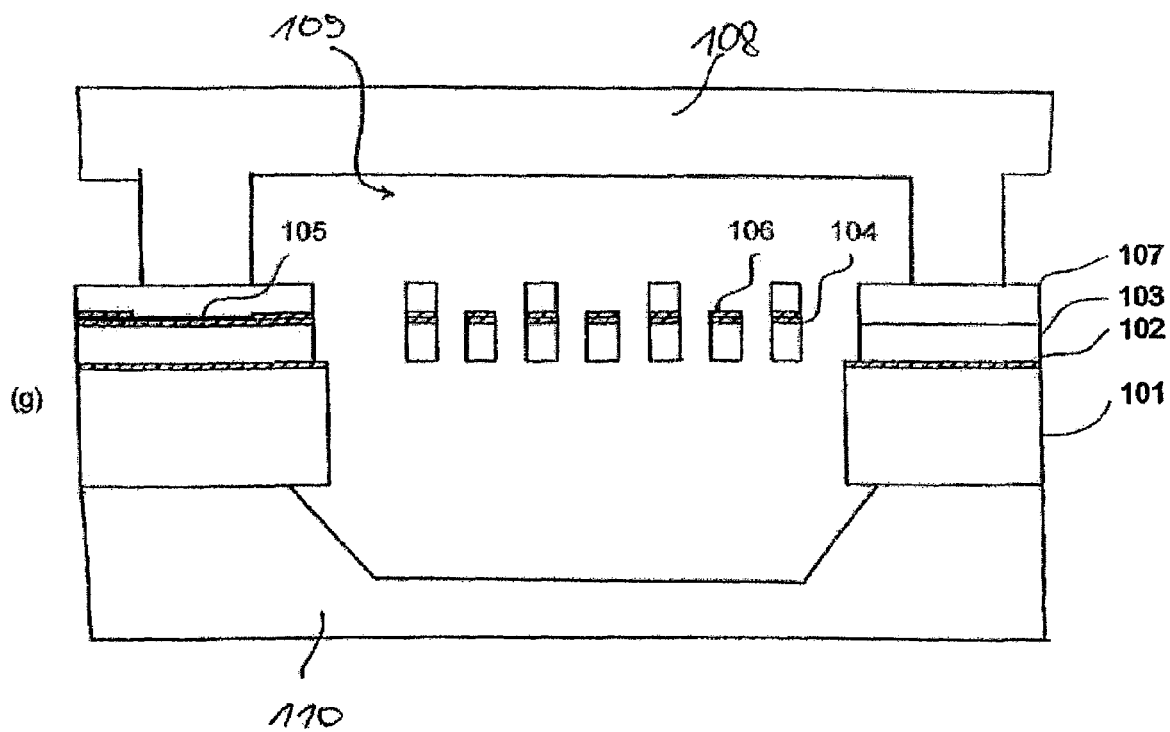
FIG. 7 shows an example of the encapsulation of the proposed micro-mirror actuator.

Finally, FIG. 7 shows an example of a state in which the produced micro-scanner mirror is encapsulated hermetically sealed on the wafer level by application of a cover plate and a floor plate. The entire wafer level package comprising three wafers is shown in cross-section in this case. A preprocessed glass cover wafer 108 is anodically bonded to the top side of the MEMS wafer, the substrate 101, having the layers situated thereon. This is made possible by the peripheral frame without interruption around the inner area, whose top side is formed by the epipoly layer 107, whose surface is additionally polished. This glass cover wafer 108 has suitable cavities 109, which allow the intended movement of the actuator element inside the encapsulated area. The MEMS wafer is also closed on the back by a glass floor wafer 110 which is bonded on anodically or eutectically. This does not represent a problem because of the high surface quality of the back of the wafer substrate 101.

The proposed method is suitable, as shown in the exemplary embodiments, for the production of electrostatically driven single-axis and multiaxis micro-scanner mirrors, for example. The method allows the production of finger-shaped or comb-shaped drive electrodes, which have a vertical height offset and may be activated via separate potentials from one another. An additional wiring level between these two levels allows an arbitrary number of activation or sensor potentials which are insulated from one another to be implemented. A closed frame which encloses the inner area of the component and is at least formed by the uppermost semiconductor layer allows a hermetically sealed wafer level package by anodic or eutectic wafer bonding, for example. The integrated buried conductor level connects external terminal areas by lateral pass-throughs to the electrodes of the actuator, without impairing the surface quality of the frame necessary for the hermetically sealed encapsulation. Mirror plate, suspension structures, and electrodes may be implemented independently one another in at least three different layer thicknesses by the method sequence. The problem of dynamic mirror deformation may advantageously be counteracted by these three locally selectable layers having the different bending rigidities thus possible.

LIST OF REFERENCE NUMERALS 101 silicon wafer
102 $SiO_2$ layer
103 epipoly layer
104 TEOS oxide layer
105 polysilicon layer
106 TEOS oxide layer
107 epipoly layer
108 glass cover wafer
109 cavities
110 glass floor wafer
201 silicon wafer
202 $SiO_2$ layer
203 epipoly layer
204 TEOS oxide layer
205 polysilicon layer
206 TEOS oxide layer
207 epipoly layer
309 micro-scanner mirror
310 frame
311 mirror plate
312 suspensions
503 epipoly layer
504 TEOS oxide layer
506 TEOS oxide layer
507 epipoly layer
603 epipoly layer
604 TEOS oxide layer
606 TEOS oxide layer
607 epipoly layer
701 silicon wafer
702 $SiO_2$ layer
703 epipoly layer
704 TEOS oxide layer
706 TEOS oxide layer
707 epipoly layer

The invention claimed is:

1. A method for producing a micro-mirror actuator, which has, in an inner area, at least one movable micro-mirror element and multiple finger-shaped or comb-shaped electrodes for activating the micro-mirror element, which are offset to one another in height,
wherein a layered construction made of at least three main layers (101, 103, 107) is generated, which are at least sectionally electrically insulated from one another via intermediate layers (102, 104, 106), and the layers are designed and structured to form the micro-mirror element and the electrodes,
the structuring of the layers being performed in such a way that a closed frame (310) is obtained from at least the uppermost layer (107), which encloses the inner area of the actuator and allows a hermetic encapsulation of the inner area by application of a cover plate on the frame (310), and, during the generation of the layered construction, a conductor level (105), which is electrically insulated from these main layers via the intermediate layers, is generated between at least two of the main layers and structured to form conductor paths, which allow electrical contact to one or more of the electrodes from outside the frame (310) after the formation of contact openings in one or more of the intermediate layers (102, 104, 106).

2. The method according to claim 1,
wherein a top side of the frame (310) is polished after the structuring.

3. The method according to claim 1,
wherein the production is performed on the wafer level by generating the layered construction for a plurality of micro-mirror actuators situated adjacent to one another on a wafer, which forms one of the main layers.

4. The method according to claim 3,
wherein, after the structuring, a further wafer (108) or a substrate of the size of a wafer is applied as a cover plate to the layered construction and bonded hermetically sealed to the frame (310) of the micro-mirror actuators situated adjacent to one another.

5. The method according to claim 4,
wherein a cover plate, which is transparent in at least one optical wavelength range, is used.

6. The method according to claim 4,
wherein the cover plate is applied by anodic or eutectic bonding or by glass frit bonding.

7. The method according to claim 1,
wherein the layers are designed and structured to form a single-axis or multiaxis movable micro-mirror plate (311) as the micro-mirror element.

8. A micro-mirror actuator, which, in an inner area, has at least one movable micro-mirror element and multiple finger-shaped or comb-shaped electrodes for activating the micro-mirror elements, which are offset to one another in height, wherein
the actuator is formed from a layered construction made of at least three main layers (101, 103, 107), which are at least sectionally electrically insulated from one another via intermediate layers (102, 104, 106),
the inner area is enclosed by a closed frame (310) made of at least the uppermost layer (107), which allows a hermetic encapsulation of the inner area by application of a cover plate onto the frame (310), and
a conductor level (105), which is insulated from these main layers via the intermediate layers, is situated between at least two of the main layers, having conductor paths, which allow electrical contact to one or more of the electrodes from outside the frame (310) via contact openings in one or more of the intermediate layers (102, 104, 106).

9. The micro-mirror actuator according to claim 8,
wherein the micro-mirror element is a single-axis or multiaxis movable micro-mirror plate (311).

10. The micro-mirror actuator according to claim 8,
wherein a cover plate is applied hermetically sealed onto the frame (310).

11. The micro-mirror actuator according to claim 10,
wherein the cover plate is transparent in at least one optical wavelength range.

* * * * *